(12) United States Patent  
Brenden

(10) Patent No.: US 7,042,256 B2
(45) Date of Patent: May 9, 2006

(54) VOICE COIL MOTOR POWER AMPLIFIER

(75) Inventor: Jason P. Brenden, Woodbury, MN (US)

(73) Assignee: Agere Systems Inc., Allentown, PA (US)

( * ) Notice: Subject to any disclaimer, the term of this patent is extended or adjusted under 35 U.S.C. 154(b) by 1 day.

(21) Appl. No.: 10/619,802

(22) Filed: Jul. 15, 2003

(65) Prior Publication Data

US 2005/0013029 A1   Jan. 20, 2005

(51) Int. Cl.
*H03K 3/00* (2006.01)

(52) U.S. Cl. .................................... 327/110; 327/423

(58) Field of Classification Search ........ 327/108–112, 327/423, 494; 360/75; 318/560
See application file for complete search history.

(56) References Cited

U.S. PATENT DOCUMENTS

| 5,257,175 | A | * | 10/1993 | Skelton et al. | ........... | 363/56.02 |
| 5,289,098 | A | * | 2/1994 | Shinozaki | .................... | 318/696 |
| 6,023,143 | A | * | 2/2000 | Salina et al. | ................. | 318/599 |
| 6,064,174 | A | * | 5/2000 | Sziebert | ....................... | 318/801 |
| 6,150,853 | A | * | 11/2000 | Chrappan et al. | ........... | 327/108 |
| 6,151,186 | A | * | 11/2000 | O'Farrell | ................. | 360/78.04 |

* cited by examiner

*Primary Examiner*—Kenneth B. Wells
(74) *Attorney, Agent, or Firm*—Kinney&Lange, PA

(57) ABSTRACT

An operational amplifier connected to first and second transistors of an H-bridge for sinking and sourcing current, the operational amplifier having a differential input and an output and comprising a transconductance circuit, a gain circuit, a buffer circuit, and first and second feedback networks. The transconductance circuit is connected to receive the differential input and provide an output, wherein the output is connected to the second transistor of the H-bridge. The gain circuit is connected to receive the output from the transconductance circuit, wherein the gain circuit includes a transistor that is matched to the second transistor of the H-bridge. The buffer circuit is connected between the gain circuit and the first transistor of the H-bridge. The first feedback network comprises a level shift circuit connected to the output of the operational amplifier and a clamping circuit connected between the level shift circuit and an input of the buffer circuit. The second feedback network comprises a level shift circuit connected to the output of the operational amplifier and a clamping circuit connected between the level shift circuit and the first transistor of the H-bridge.

17 Claims, 5 Drawing Sheets

VOICE COIL MOTOR POWER AMPLIFIER

CROSS-REFERENCE TO RELATED APPLICATION(S)

None.

BACKGROUND OF THE INVENTION

The present invention relates to a disk drive system utilizing a voice coil motor (VCM). In particular, the present invention is a VCM power amplifier circuit having reduced silicon die area and improved performance.

The actuator in a hard disk drive, sometimes called the voice coil motor (VCM), moves the read and write heads across the disk. In most disk drive systems, an integrated circuit (IC), called the motor controller IC, contains the necessary circuitry to regulate the current through the VCM. In most systems, the entire power amplifier that is connected directly to the VCM is included in the motor controller IC. The circuit typically consists of an H-bridge using NDMOS transistors (due to their lower on state resistance), and two amplifiers each with a gain of A/2 but with opposite input polarities, resulting in a differential amplifier with a gain of A. A power amplifier must be designed with a gain of A that uses a small amount of silicon die area, has good linearity including low crossover distortion, requires minimum power dissipation, and has a relatively large bandwidth and slew rate. These are all conflicting requirements that make the design of the power amplifier difficult.

Class AB power amplifiers have been typically used to control voice coil motors because of their low crossover distortion. Unlike other power amplifiers, Class AB power amplifiers continually bias a small quiescent current through the output transistors. A typical class AB power amplifier will either use separate operational amplifiers (opamps) to control both upper and lower NDMOS transistors on each half of an H-bridge, or one opamp to control the bottom NDMOS and an open loop level shifter to control the top NDMOS on each half of the H-bridge. Using two opamps increases power dissipation as well as die area. It also makes stabilizing the feedback loops difficult and causes problems during large step inputs, which may result in shoot-through current. Additional anti-shoot-through circuitry must be added to eliminate the possibility of both upper and lower NDMOS conduction, which further increases die area and complexity. Using only one opamp to control the bottom NDMOS and simply level shifting to control the upper NDMOS decreases linearity. It also makes voltage gains (other than one) more difficult to obtain.

BRIEF SUMMARY OF THE INVENTION

The present invention is an operational amplifier connected to first and second transistors of an H-bridge for sinking and sourcing current. The operational amplifier has a differential input and an output, and comprises a transconductance circuit, a gain circuit, a buffer circuit, and first and second feedback networks. The transconductance circuit is connected to receive the differential input and provide an output, wherein the output is connected to the second transistor of the H-bridge. The gain circuit is connected to receive the output from the transconductance circuit, wherein the gain circuit includes a transistor that is matched to the second transistor of the H-bridge. The buffer circuit is connected between the gain circuit and the first transistor of the H-bridge. The first feedback network comprises a level shift circuit connected to the output of the operational amplifier and a clamping circuit connected between the level shift circuit and an input of the buffer circuit. The second feedback network comprises a level shift circuit connected to the output of the operational amplifier and a clamping circuit connected between the level shift circuit and the first transistor of the H-bridge.

DETAILED DESCRIPTION

Figure 1:
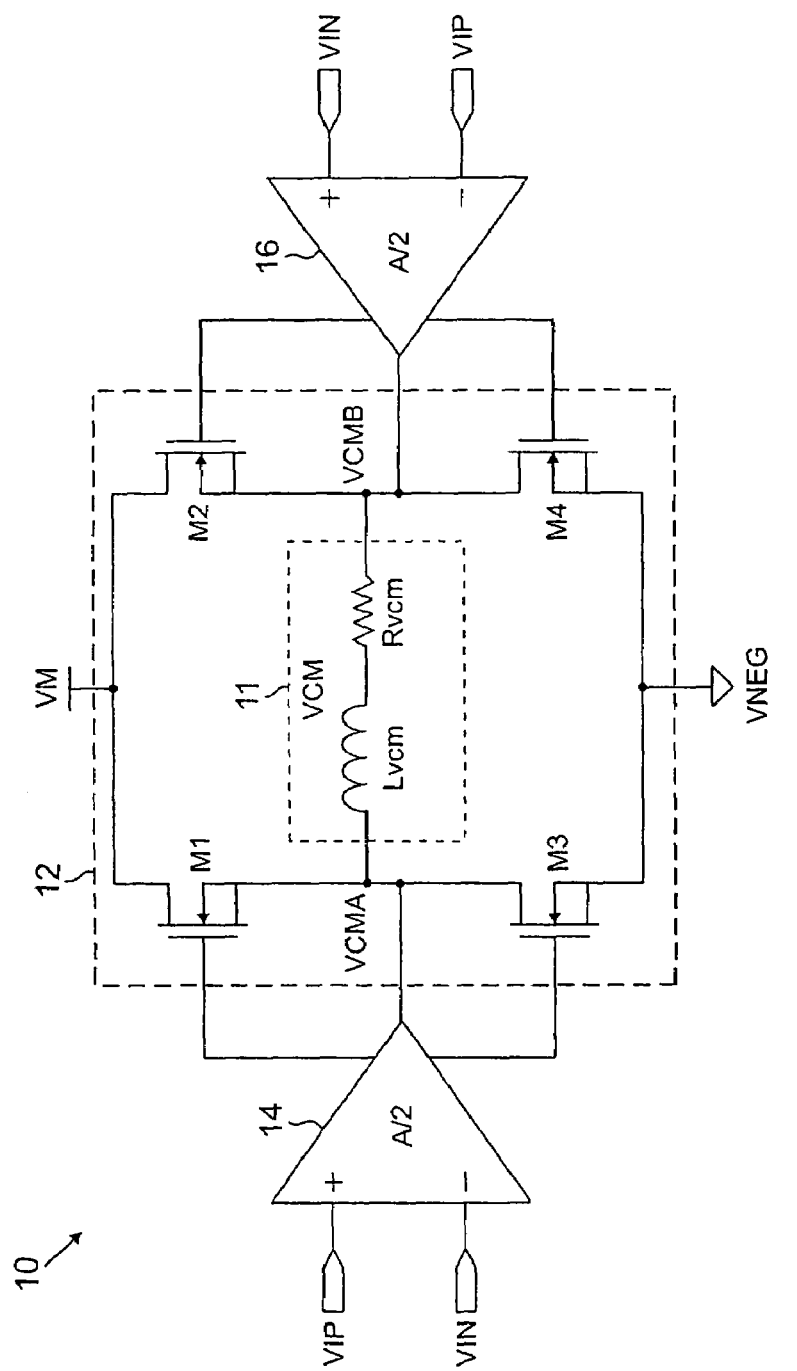
FIG. 1 is a schematic diagram of a VCM power amplifier.

FIG. 1 is a schematic diagram of a typical power amplifier 10 for controlling the current through a voice coil motor (VCM) 11 represented in the diagram as an inductive coil $L_{VCM}$ and a resistor $R_{VCM}$. VCM 11 is coupled into the remainder of the circuit between motor nodes VCMA and VCMB. Power amplifier 10 includes an H-bridge 12, amplifiers 14 and 16, voltage supply nodes VM and VNEG, input nodes VIP and VIN, and the motor nodes VCMA and VCMB previously mentioned.

H-bridge 12 includes transistors M1–M4. Transistors M1–M4 are NDMOS transistors each having a source, a drain, a gate and a body. Each of transistors M1–M4 has its source connected to its body. The drains of transistors M1 and M2 are each connected to voltage supply node VM, and the sources of transistors M1 and M2 are each connected to a corresponding one of motor nodes VCMA and VCMB. The drains of transistors M3 and M4 are each connected to a corresponding one of motor nodes VCMA and VCMB, and the sources of transistors M3 and M4 are each connected to voltage supply node VNEG. The gates of transistors M1 and M3 are each connected to amplifier 14, and the gates of transistors M2 and M4 are each connected to amplifier 16.

Amplifiers 14 and 16 each has a gain of A/2. Amplifier 14 has a positive input connected to input node VIP, a negative input connected to input node VIN, and an output connected to motor node VCMA. Amplifier 16 has a positive input connected to input node VIN, a negative input connected to input node VIP, and an output connected to motor node VCMB. Because amplifiers 14 and 16 each has a gain of A/2 but with opposite input polarities, power amplifier 10 functions as a differential amplifier with a gain of A.

Figure 2:
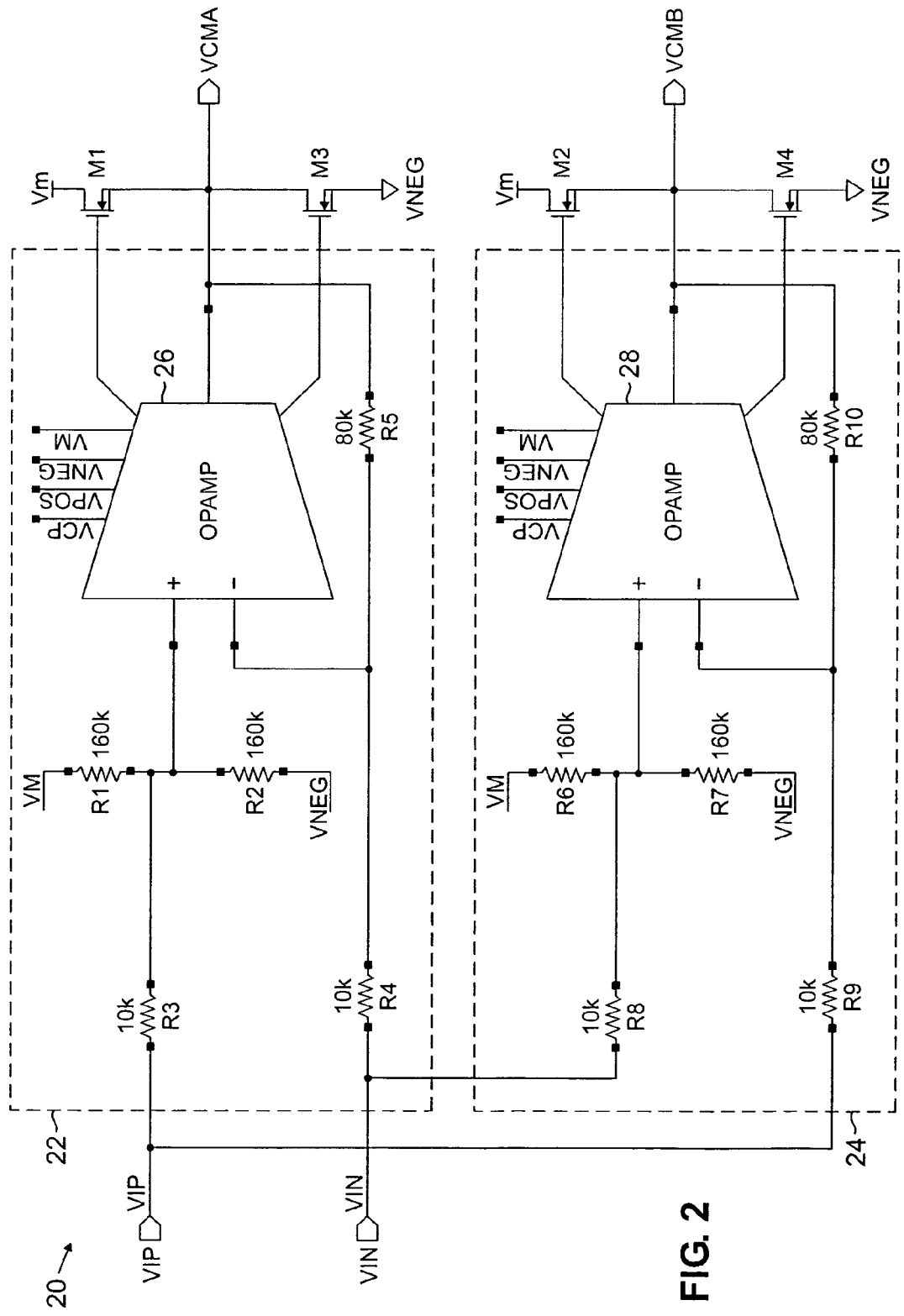
FIG. 2 is a schematic diagram of an amplifier circuit employed in a first embodiment of a VCM power amplifier of the present invention.

FIG. 2 is a schematic diagram of a class AB amplifier circuit 20 employed in a first embodiment of a VCM power amplifier of the present invention. Amplifier circuit 20 is divided into subcircuits 22 and 24, which correspond to amplifiers 14 and 16 in FIG. 1. Subcircuits 22 and 24 each include an operational amplifier with resistive feedback to set the gain.

Subcircuit 22 includes operational amplifier 26 and resistors R1–R5. Resistor R1 is connected between voltage supply node VM and a positive input of opamp 26. Resistor R2 is connected between the positive input of opamp 26 and voltage supply node VNEG. Resistor R3 is connected between input node VIP and the positive input of opamp 26, and resistor R4 is connected between input node VIN and a negative input of opamp 26. Resistor R5 is connected between the negative input and an output of opamp 26, and the output of opamp 26 is connected to motor node VCMA.

Subcircuit 24 is similar to subcircuit 22, and includes operational amplifier 28 and resistors R6–R10. Resistor R6 is connected between voltage supply node VM and a positive input of opamp 28. Resistor R7 is connected between the positive input of opamp 28 and voltage supply node VNEG. Resistor R8 is connected between input node VIN and the positive input of opamp 28, and resistor R9 is connected between input node VIP and a negative input of opamp 28. Resistor R10 is connected between the negative input and an output of opamp 28, and the output of opamp 28 is connected to motor node VCMB.

In subcircuit 22, the gain of opamp 26 is set by the ratio of resistors R1–R5. The output reference is determined by resistors R1 and R2. If resistors R1 and R2 are set equal, then the output reference will be half of supply voltage VM (VM is the motor supply). This allows for maximum voltage swing at the output. If resistors R3 and R4 are set equal, and resistor R1 (R2) is set equal to 2*R5, then the gain of opamp 26 will be equal to R5/R4. In this example the gain is chosen to be 8V/V. Note that in subcircuit 24, opamp 28 has exactly the same feedback resistor values but has the input polarity inverted. In this way, a differential amplifier with a gain of 16V/V and a common mode at half of the supply voltage is provided.

Figure 3:
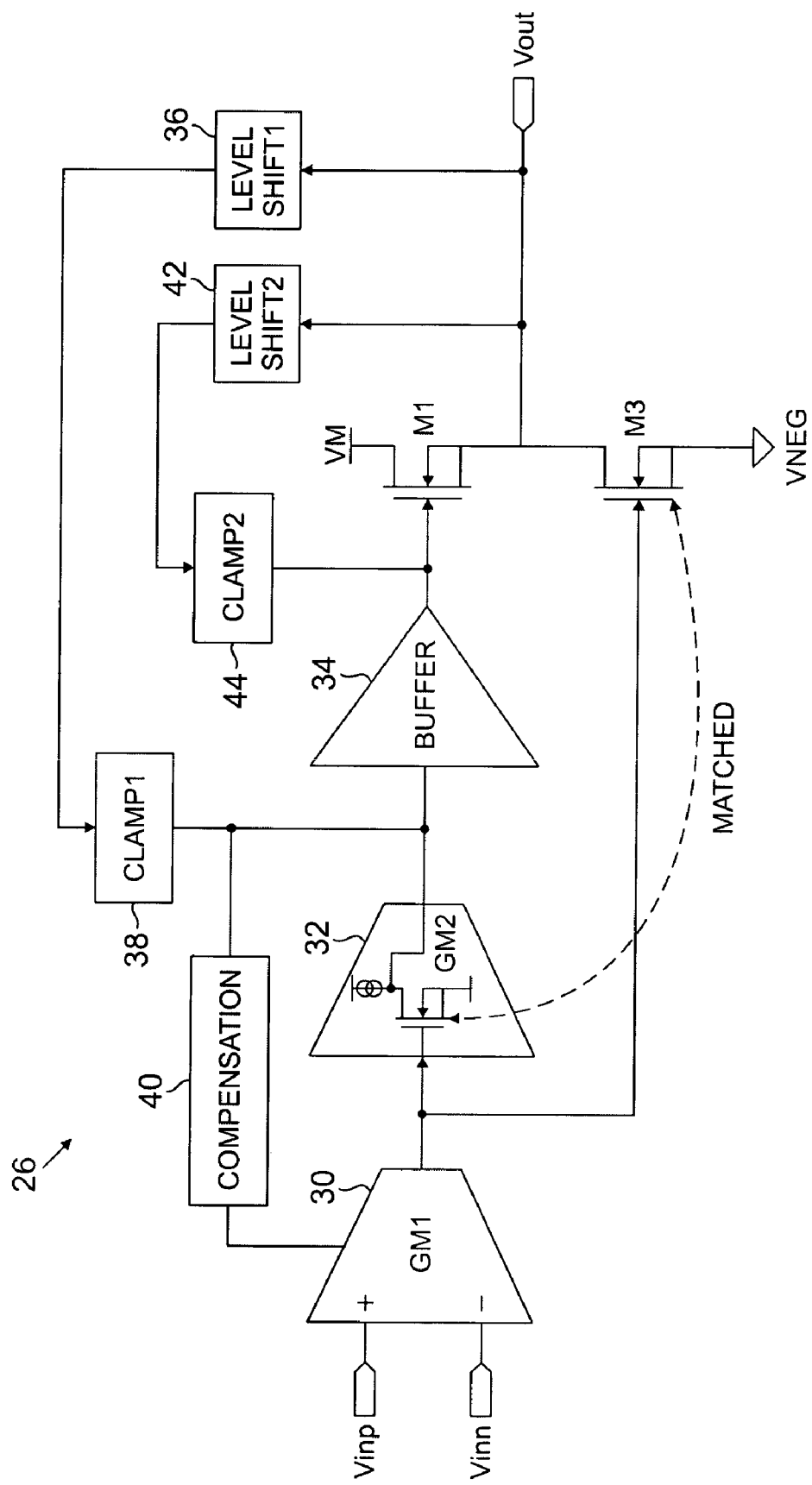
FIG. 3 is a block diagram of an opamp from an amplifier circuit employed in a first embodiment of a VCM power amplifier of the present invention.

FIG. 3 is a block diagram of opamp 26 from amplifier circuit 20 in FIG. 2. Opamp 26 includes a first transconductance (Gm) stage 30, a second Gm stage 32, a buffer stage 34, a first level shifter 36, a first clamp 38, a compensation circuit 40, a second level shifter 42, a second clamp 44, a positive input node Vinp, a negative input node Vinn, and an output node Vout. Transistors M1 and M3 are the H-bridge transistors in FIG. 1.

First Gm stage 30 has a positive and a negative input, which correspond to the positive and negative input nodes Vinp and Vinn, respectively. First Gm stage 30 has an output connected to an input of second Gm stage 32 and also the gate of transistor M3. Second Gm stage 32 has an output connected to an input of buffer stage 34, which in turn has an output connected to the gate of transistor M1. First level shifter 36 has an input connected to output node Vout (which is connected to motor node VCMA), and an output connected to an input of first clamp 38. First clamp 38 has an output connected to the input of buffer stage 34. Compensation circuit 40 is connected from the output of second Gm stage 32 to first Gm stage 30. Second level shifter 42 has an input connected to output node Vout (which is connected to motor node VCMA), and an output connected to an input of second clamp 44. Second clamp 44 has an output connected to the gate of transistor M1.

First Gm stage 30 is a current mirror output transconductance amplifier (OTA) with current gain. Second Gm stage 32 is a common source amplifier stage, which includes a transistor connected to the output of Gm stage 30. This transistor drives buffer stage 34 and is matched to transistor M3. Buffer stage 34 includes a source follower that acts as a buffer to drive upper transistor M1. Quiescent current through transistors M1 and M3 is set by the relationship between second Gm stage 32 and lower transistor M3. First clamp 38 is a voltage clamp for upper transistor M1 (while lower transistor M3 is sinking current from the output) for dramatically improving crossover distortion when transitioning from sinking to sourcing current. First level shifter 36 provides a small level shift up to ensure that first clamp 38 is not on while upper transistor M1 is sourcing current to the output. Compensation circuit 40 allows opamp 26 to obtain a closed loop bandwidth that is similar whether sinking or sourcing current. Second level shifter 42 provides the appropriate level shift up to drive second clamp 44 in order to limit the gate to source voltage of transistor M1 to its maximum allowable value (and thus minimize its resistance) during a saturation condition.

Figure 4:
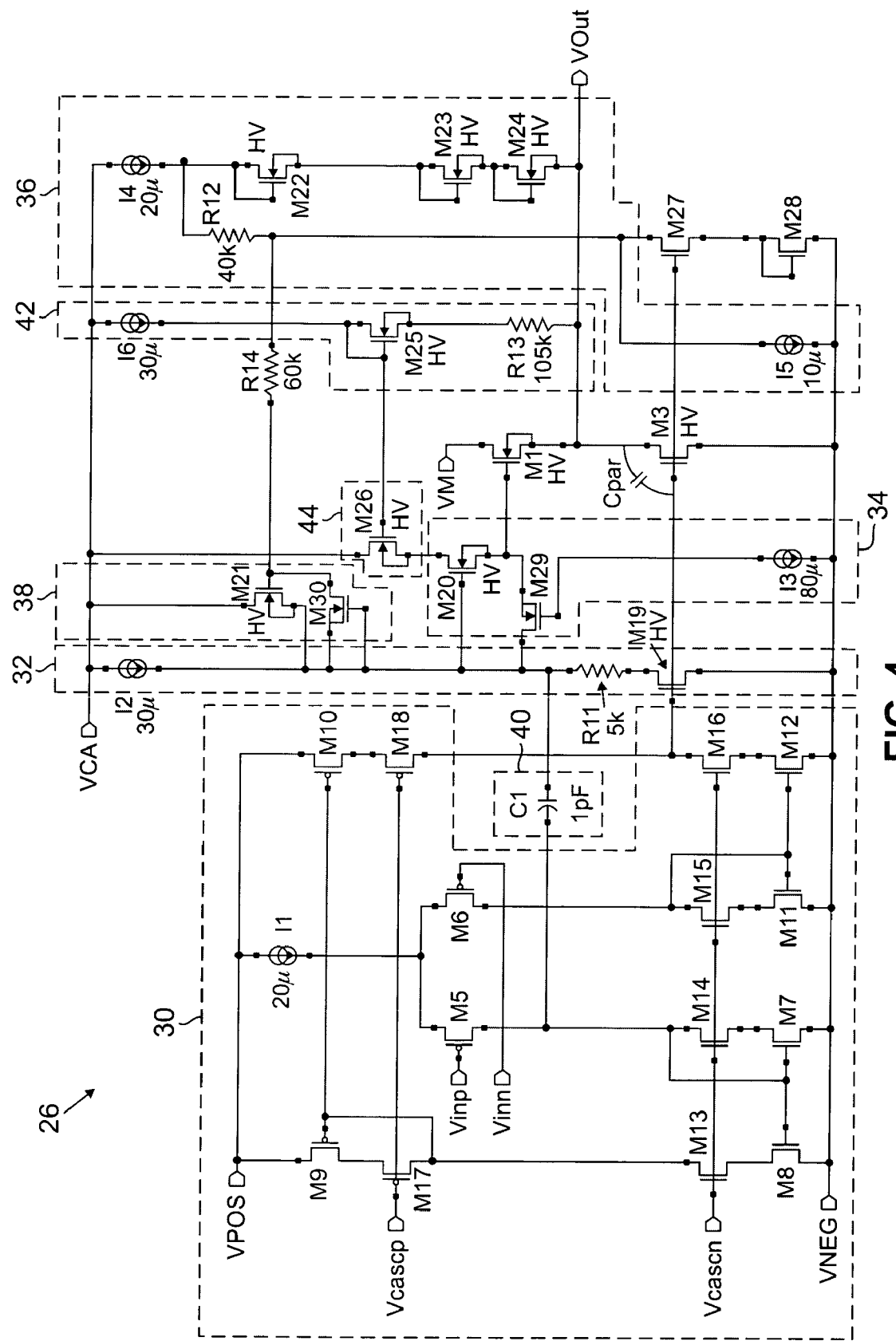
FIG. 4 is a circuit diagram of an opamp from an amplifier circuit employed in a first embodiment of a VCM power amplifier of the present invention.

FIG. 4 is a circuit diagram of opamp 26 from amplifier circuit 20 in FIG. 2. In order to simplify the circuit diagram, the block diagram designations used in FIG. 3 have been included in FIG. 4.

Opamp 26 uses three supplies. The VPOS and VM supplies are 3.3V and 12V supplies, respectively (commonly used in a hard disc drive motor controller IC). The 3.3V supply drives all core circuitry, while the 12V supply is used to drive the motor. The last supply is a high voltage supply VCP. This is typically a low current supply generated with a charge pump circuit. This supply is needed in order to drive the upper NDMOS gate higher than 12V in order to fully turn it on. VCP is typically about 17V.

Because a standard motor control circuit consists of high voltage DMOS as well as standard low voltage CMOS, FIG. 4 designates high voltage DMOS with the symbol HV, while standard CMOS will have no designation. In general, standard low voltage CMOS is used wherever possible to minimize die area. Opamp 26 is divided into two main parts. The left side of the circuit runs off the low voltage VPOS supply, while the right side runs off of the high voltage VCP supply. Because the differential input is assumed to operate at a common mode within the VPOS supply, the input gain stage may run off of the VPOS supply and therefore use all low voltage CMOS. The values of bias currents in this implementation of opamp 26 are shown next to the given current source (these values are exemplary only, and are not limiting). The first stage (first Gm stage 30) is a current mirror output transconductance amplifier (OTA) with current gain. The differential voltage input at input nodes Vinp and Vinn is applied across input differential pair M5/M6 to create a differential current. This current is mirrored by M7/M8 and is mirrored and amplified by M9/M10 and M11/M12. The current amplification made by the size ratio between M9 (M11) and M10 (M12) provides more current to the gates of M19 and M3 and will be important in the compensation discussed later. M13, M14, M15 and M16 are NMOS cascode devices, while M17 and M18 are PMOS cascode devices. M13–M18 are added to increase gain, and are biased using a standard wide-swing bias circuit (nodes Vcascp and Vcascn). M19 and I2 form a common source second stage (second Gm stage 32). This stage runs off of the VCP supply because it will be used to eventually drive the gate of the high voltage NDMOS M1. The common-source amplifier output drives the gate of source follower M20, which gets its bias current from I3. The source follower (buffer stage 34) acts as a unity gain buffer to drive the upper gate NDMOS M1. Quiescent current through the output DMOS bridge is set by the size ratio between matched devices M3 and M19. In a balanced case where the current through the coil is zero, negative feedback action will force current through the output devices to be I2 times the size ratio of M3 and M19. In an exemplary implementation, this ratio is chosen in order to obtain a 1 mA bias current through the output DMOS. The ratio is then 1 mA/30 µA or about 33. Note that output DMOS transistors M1 and M3 are typically very large devices as a result of low on-resistance requirements due to the large currents that are driven through the coil during a seek operation (greater than 1 A).

Opamp 26 drives a motor load consisting of an inductor and a resistor. The resistance is typically 6–10 Ohms. Because of this fact, the circuit must be able to operate at a steady state condition while either sinking or sourcing large amounts of current while maintaining accurate voltage gain. The circuit operates quite differently while sinking large currents. In this case, the bottom NDMOS device acts as a common source amplifier to the output. Its gate will be driven to whatever voltage is needed in order to sink the required current from the output. During this time, the top part of the circuit is no longer part of the feedback loop. This is because the large current through M3 means that M19 must also have a large current. This current will be larger than current source I2, which causes the drain of M19 to fall, as well as the gate of M20. This turns off M1. The gate of M20 is not allowed to fall all the way down to zero. Instead, it is clamped using device M21 (first clamp 38) to a voltage slightly below the voltage necessary to keep the output upper DMOS M1 biased near a threshold voltage. Clamping the upper voltage dramatically improves crossover distortion when transitioning from sinking to sourcing current. Resistor R11 limits current through clamp device M21 and protects the gate oxide of the clamp device. The gate of clamp device M21 is biased from a DC level shift of the output. This level shift is designed to match the level shift through clamp device M21 itself with source follower M20 and high side NDMOS M1. The clamp bias is formed from diode connected devices M22, M23 and M24 and current source I4 (first level shifter 36). A small level shift down is implemented by R12 and I5 in order to ensure that clamp device M21 is not on while the upper path is an active part of the feedback network.

There are a couple of things to note about opamp 26 in regards to compensation. First, device M3 has a large gate to drain capacitance (approximately 7 pF). This parasitic capacitance is shown in the schematic as Cpar. This capacitance increases substantially (approximately two times) with decreasing gate to drain voltage. This capacitance is around a high gain stage such that its capacitance gets Miller multiplied and would be difficult not to use as part of the compensation. Because the circuit operates in two different modes depending on whether it is sinking or sourcing current, it is desirable to obtain a closed loop bandwidth that is similar in either case. In the balanced or sourcing current condition, two stage amplifiers are typically compensated around the second stage to take advantage of Miller multiplication. However, to obtain a resulting bandwidth comparable to the case when only bottom FET M3 is on, a compensation capacitor near 7 pF in value would need to be utilized. Since the voltage at the drain of M19 operates at high voltage, a high voltage capacitor would be necessary which would be very space inefficient. Instead of placing the compensation capacitor directly around M19, capacitor current can be amplified by feeding back inside the first stage OTA. This has the advantage of multiplying the effective capacitor by the current gain as well as removing the typical right half plane zero associated with the standard Miller capacitor. In this case the gain is seven, so that capacitor C1 (compensation 40) with a value of 1 pF can be used but gets multiplied to look like a 7 pF capacitor, which is comparable to the capacitance Cpar of M3 and occupies a small space. Now, whether sinking or sourcing current, effective compensation capacitance will be close to two times 7 pF. Input transistors are sized in order to obtain closed loop bandwidths including resistor feedback divider close to 1 MHz.

Another important part of a VCM power amplifier is its operation during saturation. During a seek operation, a large input signal is applied to the power amplifier such that its output saturates against the supplies, and appropriate upper and lower NDMOS are driven into the triode region such that they act as resistors. In order to obtain the smallest possible resistance, the gate to source voltage must be driven to its maximum. By driving bottom device M3 from the VPOS supply, when the input stage saturates, the gate of M3 will be driven to VPOS. By making VPOS equal to the maximum gate to source voltage (in this case 3.3V), bottom NDMOS M3 will have minimum resistance. In order to obtain the same condition on upper NDMOS M1, some additional circuitry must be added. Current 16 is pulled through resistor R13 such that a 3.3V battery is generated on top of the output voltage (second level shifter 42). This voltage is applied to diode-connected device M25 that drives the gate of clamp device M26 (second clamp 44) such that when the circuit saturates in the positive direction, M20 will be fully turned on so that the source of M20 will follow the source of M26 to 3.3V above the output voltage. This places 3.3V across the gate to source of upper NDMOS M1 and minimizes its resistance.

Other circuitry includes M27 and M28 added in order to pull the gate of upper DMOS M1 all the way to zero in a saturated condition. This path will not conduct unless the M3 gate voltage is large indicating a saturated condition due to diode-connected device M28. Diode clamp devices M29 and M30 limit gate oxide breakdown of M20 and M21, respectively. R14 allows the gate of M20 to pull up near the supply VCP during the case of saturating high instead of getting clamped by M30, R12, M22, M23 and M24.

Figure 5A:
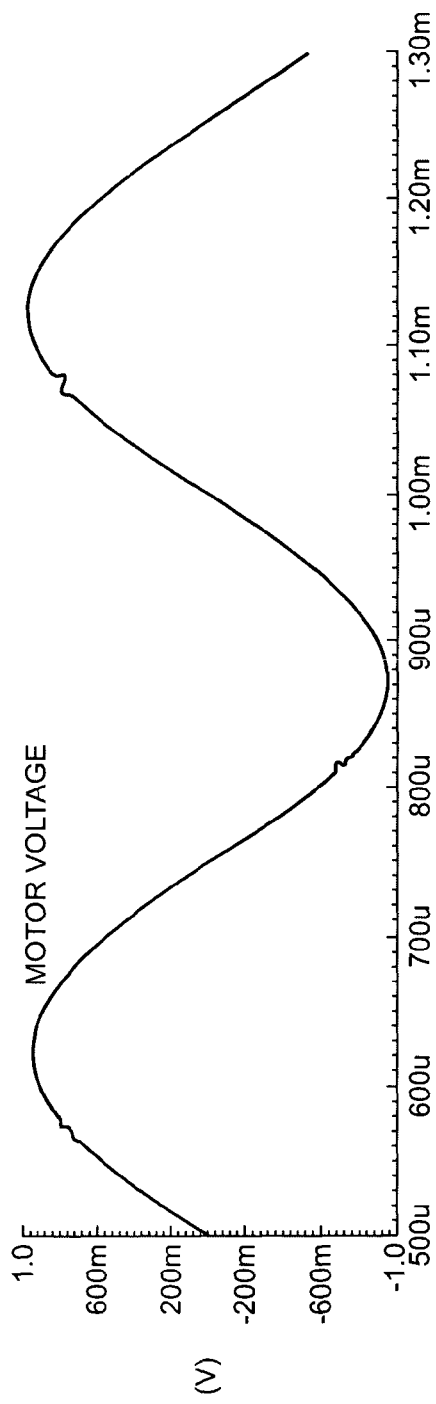
FIG. 5A is a graph of the motor voltage output of a first embodiment of a VCM power amplifier of the present invention.
Figure 5B:
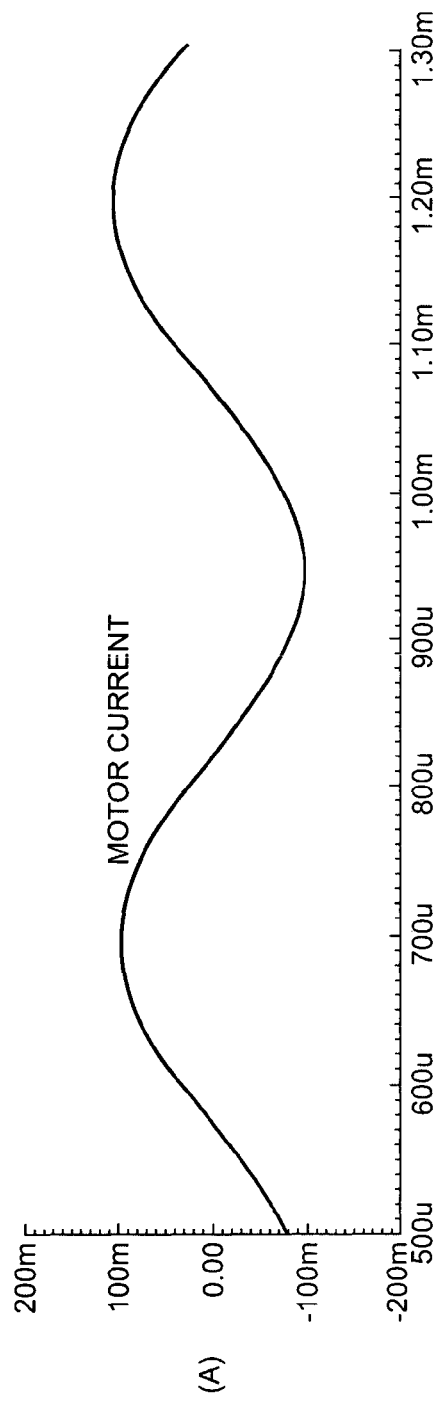
FIG. 5B is a graph of the motor current output of a first embodiment of a VCM power amplifier of the present invention.

FIGS. 5A and 5B show waveforms of the output of amplifier circuit 20. Each waveform is produced using a 2 kHz sinusoidal input. FIG. 5A shows the motor voltage (V) as a function of time (s). FIG. 5B shows the motor current (A) as a function of time (s). Note that when the motor current crosses zero, the motor voltage has a very small disturbance. Distortion in the motor current is unnoticeable. The total harmonic distortion of the motor current is less than 0.3%.

Because a single amplifier is used to drive each half bridge circuit, the circuit occupies a small amount of silicon die area. It also takes advantage of current multiplication to increase the effective compensation capacitor to save die area. A clamp based on the output voltage limits the swing on the upper NDMOS transistor such that it dramatically improves the crossover distortion when the current crosses through zero. The upper and lower NDMOS transistors have a gate to source limit built into the circuit such that during a saturated case, a minimum resistance through upper and lower FETs is achieved.

Although the present invention has been described with reference to preferred embodiments, workers skilled in the art will recognize that changes may be made in form and detail without departing from the spirit and scope of the invention.

The invention claimed is:

1. An operational amplifier connected to first and second transistors of an H-bridge for sinking and sourcing current, the operational amplifier having a differential input and an output and comprising:

a transconductance circuit connected to receive the differential input and provide an output, wherein the output is connected to the second transistor of the H-bridge;

a gain circuit connected to receive the output from the transconductance circuit, wherein the gain circuit includes a transistor that is matched to the second transistor of the H-bridge;
a buffer circuit connected between the gain circuit and the first transistor of the H-bridge;
a first feedback network comprising:
a level shift circuit connected to the output of the operational amplifier; and
a clamping circuit connected between the level shift circuit and an input of the buffer circuit; and
a second feedback network comprising:
a level shift circuit connected to the output of the operational amplifier; and
a clamping circuit connected between the level shift circuit and the first transistor of the H-bridge.

2. The operational amplifier of claim 1 and further comprising a compensation circuit connected between an output of the gain circuit and the transconductance circuit.

3. The operational amplifier of claim 2 wherein the compensation circuit is a capacitor.

4. The operational amplifier of claim 1 wherein the transconductance circuit is a current mirror output transconductance amplifier.

5. The operational amplifier of claim 1 wherein the gain circuit is a common source amplifier.

6. The operational amplifier of claim 1 wherein the buffer circuit is a source follower circuit.

7. The operational amplifier of claim 1 wherein the clamping circuit of the first feedback network clamps the buffer circuit in order to bias the first transistor of the H-bridge slightly below a threshold voltage when the operational amplifier is sinking current.

8. The operational amplifier of claim 1 wherein the clamping circuit of the second feedback network minimizes the resistance of the second transistor of the H-bridge during a saturation condition.

9. The operational amplifier of claim 1 wherein the operational amplifier is implemented as an integrated circuit (IC).

10. A voice coil motor control circuit for controlling current through a voice coil motor, the control circuit comprising:
first and second input sinnal nodes for receivimi input signals:
first and second voice coil motor nodes for connection to the voice coil motor:
an H-bridge circuit comprising:
a first transistor having a conduction path connected between a first voltage supply node and the first voice coil motor node, the first transistor further having a control region for controlling conduction through the conduction path;
a second transistor having a conduction path connected between the first voltage supply node and the second voice coil motor node, the second transistor further having a control region for controlling conduction through the conduction path;
a third transistor having a conduction path connected between the first voice coil motor node and a second voltage supply node, the third transistor further having a control region for controlling conduction throuah the conduction path; and
a fourth transistor having a conduction path connected between the second voice coil motor node and the second voltage supply node, the fourth transistor further having a control region for controlling conduction through the conduction path;

a first power amplifier circuit comprising:
a single operational amplifier connected to the first voice coil motor node and the control regions of the first and third transistors;
a first resistance network connected to the first input signal node and the operational amplifier;
a second resistance network connected to the second input signal node and the operational amplifier; and
a second power amplifier circuit comprising:
a single operational amplifier connected to the second voice coil motor node and the control regions of the second and fourth transistors; and
a third resistance network connected to the second input signal node and the operational amplifier;
a fourth resistance network connected to the first input signal node and the operational amplifier;
wherein the operational amplifier of the first power amplifier circuit comprises:
a transconductance circuit connected to receive a differential input from the first and second resistance networks of the first power amplifier circuit and provide an output, wherein the output is connected to the control region of the second transistor of the H-bridge circuit;
a gain circuit connected to receive the output from the transconductance circuit, wherein the gain circuit includes a transistor that is matched to the second transistor of the H-bridge circuit;
a buffer circuit connected between the gain circuit and the control region of the first transistor of the H-bridge circuit;
a first feedback network comprising:
a level shift circuit connected to an output of the operational amplifier; and
a clamping circuit connected between the level shift circuit and an input of the buffer circuit; and
a second feedback network comprising:
a level shift circuit connected to the output of the operational amplifier; and
a clamping circuit connected between the level shift circuit and the control region of the first transistor of the H-bridge circuit.

11. The control circuit of claim 10 and further comprising a compensation circuit connected between an output of the gain circuit and the transconductance circuit.

12. The control circuit of claim 11 wherein the compensation circuit is a capacitor.

13. The control circuit of claim 10 wherein the transconductance circuit is a current mirror output transconductance amplifier.

14. The control circuit of claim 10 wherein the gain circuit is a common source amplifier.

15. The control circuit of claim 10 wherein the buffer circuit is a source follower circuit.

16. The control circuit of claim 10 wherein the clamping circuit of the first feedback network clamps the buffer circuit in order to bias the first transistor of the H-bridge circuit slightly below a threshold voltage when the operational amplifier of the first power amplifier circuit is sinking current.

17. The control circuit of claim 10 wherein the clamping circuit of the second feedback network minimizes the resistance of the second transistor of the H-bridge circuit during a saturation condition.

* * * * *

UNITED STATES PATENT AND TRADEMARK OFFICE
CERTIFICATE OF CORRECTION

PATENT NO. : 7,042,256 B2  
APPLICATION NO. : 10/619802  
DATED : May 9, 2006  
INVENTOR(S) : Jason P. Brenden It is certified that error appears in the above-identified patent and that said Letters Patent is hereby corrected as shown below:

Column 7, Line 44, delete "sinnal", insert --signal--  
Column 7, Line 44, delete "receivimi", insert --receiving--  
Column 7, Line 62 and 63, delete "throuah", insert --through--

Signed and Sealed this

Twenty-sixth Day of December, 2006

JON W. DUDAS  
*Director of the United States Patent and Trademark Office*